United States Patent
DiPietro et al.

(10) Patent No.: US 8,262,961 B2
(45) Date of Patent: *Sep. 11, 2012

(54) AROMATIC VINYL ETHER BASED REVERSE-TONE STEP AND FLASH IMPRINT LITHOGRAPHY

(75) Inventors: Richard Anthony DiPietro, Campbell, CA (US); Mark Whitney Hart, San Jose, CA (US); Frances Anne Houle, Fremont, CA (US); Hiroshi Ito, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 915 days.

This patent is subject to a terminal disclaimer.

(21) Appl. No.: 12/055,513

(22) Filed: Mar. 26, 2008

(65) Prior Publication Data

US 2008/0174051 A1    Jul. 24, 2008

Related U.S. Application Data

(63) Continuation of application No. 11/426,363, filed on Jun. 26, 2006, now abandoned.

(51) Int. Cl.
*B29C 41/20* (2006.01)
*B29C 41/22* (2006.01)
*B29C 59/02* (2006.01)
*B29C 59/16* (2006.01)

(52) U.S. Cl. ........ 264/134; 264/135; 264/405; 264/293; 264/296; 216/36; 430/270.1

(58) Field of Classification Search .................. None
See application file for complete search history.

(56) References Cited

U.S. PATENT DOCUMENTS

| | | | |
|---|---|---|---|
| 6,033,828 | A | 3/2000 | Shimada et al. |
| 6,110,653 | A | 8/2000 | Holmes et al. |
| 6,312,869 | B1 | 11/2001 | Watanabe et al. |
| 6,319,651 | B1 | 11/2001 | Holmes et al. |
| 6,334,960 | B1 | 1/2002 | Willson et al. |
| 6,719,915 | B2 | 4/2004 | Willson et al. |

(Continued)

OTHER PUBLICATIONS

Kim et al.; Vinyl ethers in ultraviolet curable formulations for step and flash imprint lithography; 2004 American Vacuum Society; J. Vac. Sci. Technol. B22(1), Jan./Feb. 2004; pp. 131-135.

(Continued)

*Primary Examiner* — Edmund H. Lee
(74) *Attorney, Agent, or Firm* — Schmeiser, Olsen & Watts

(57) ABSTRACT

A molding composition and a method of forming an pattern. The method includes forming on a substrate a molding layer of a molding composition of aromatic divinyl ethers; pressing the template into the molding layer, the template having a relief pattern, the molding layer filling voids in the relief pattern, the template not contacting the substrate; exposing the molding layer to actinic radiation, the actinic radiation converting the molding layer to a cured molding layer having thick and thin regions corresponding to the relief pattern; removing the template; filling the thin regions of the relief pattern with a backfill material; removing regions of the molding layer not protected by the backfill material to expose regions of the substrate; forming trenches in the exposed regions of the substrate; and removing any remaining molding layer and backfill material. A transfer layer may be used between the molding layer and the substrate.

24 Claims, 11 Drawing Sheets

U.S. PATENT DOCUMENTS

| | | |
|---|---|---|
| 7,416,831 B2 | 8/2008 | Hayashi et al. |
| 2005/0160934 A1* | 7/2005 | Xu et al. ............... 101/454 |
| 2005/0214674 A1 | 9/2005 | Sui et al. |
| 2005/0255410 A1 | 11/2005 | Guerrero et al. |
| 2006/0111454 A1 | 5/2006 | Xu et al. |
| 2007/0051697 A1 | 3/2007 | DiPietro et al. |

OTHER PUBLICATIONS

Notice of Allowance (Mail Date Sep. 30, 2009) for U.S. Appl. No. 11/426,363, filed Jun. 26, 2006, First Named Inventor—Richard Anthony DiPietro; Confirmation No. 1805.

* cited by examiner

AROMATIC VINYL ETHER BASED REVERSE-TONE STEP AND FLASH IMPRINT LITHOGRAPHY

This application is a continuation of U.S. patent application Ser. No. 11/426,363 filed on Jun. 26, 2006, now abandoned.

FIELD OF THE INVENTION

This invention relates to processes for step and flash imprint lithography and materials for use in step and flash imprint lithography.

BACKGROUND OF THE INVENTION

Imprint lithography has emerged in various forms as a potential alternative to conventional photolithography because of its ability to print smaller features at low cost. Step and flash imprint lithography (SFIL) is a variant of imprint lithography that is amenable to the resolution and overlay requirements necessary for the fabrication of advanced semiconductor devices. In SFIL, a low-viscosity photosensitive molding material is molded between a mechanically rigid template having a relief pattern and a substrate and then is exposed to actinic radiation. The resulting hardened layer, having a three dimensional pattern, can be used as an etch mask to transfer the imprinted pattern into the substrate below.

To form an effective etch mask with nanoscale features, it is often desirable to form patterned features with a large height-to-width aspect ratio. Fabricating templates and producing imprints with such aspect ratios, however, can range from extremely challenging to impossible, especially as the imprinted features approach nanometer-scale dimensions. To alleviate this problem, in SFIL, a so-called bilayer etch mask approach is employed. In this approach a silicon-containing organic material is imprinted on an underlying silicon-free organic layer that covers the substrate of interest. Because organic materials can be anisotropically plasma-etched in a highly selective manner with respect to silicon-containing organic materials, the imprinted pattern can be transferred into the underlying transfer layer to form high-aspect ratio features that can be used as an etch mask to transfer the imprinted pattern into the substrate.

Unfortunately, imprint lithography intrinsically possesses a characteristic that complicates the process just described. When producing an imprint, the molding or imprint material cannot be fully excluded between the template and the substrate. As a result, a hardened layer, called the residual layer, remains between the imprinted features. To effectively transfer the imprinted pattern into the underlying transfer layer, the residual layer must be removed. Removing the residual layer inevitably alters or damages the shape and/or the size of the imprinted features. This problem worsens as the thickness or uniformity variations of the residual layer approaches or exceeds the height of the imprinted features.

To minimize these problems associated with the residual layer, a so-called reverse-tone SFIL (SFIL-R) process was developed. In the SFIL-R approach, a non-silicon containing organic material is imprinted over a non-silicon containing organic transfer layer. After all the imprints on the substrate have been produced, the substrate is coated and cured with a silicon-containing material that ideally forms a planar surface over the imprint topography. Using plasma etch techniques and chemistries known in the art, the thickness of this silicon-containing planarizing overcoat is reduced until the tops of the imprinted features are exposed. Again, because organic materials can be anisotropically plasma-etched in a highly selective manner with respect to silicon-containing organic materials, the non-silicon containing imprinted features can be selectively removed along with the non-silicon containing transfer layer material directly beneath them. The remaining pattern, which now has the opposite or reverse tone of the originally imprinted pattern, can serve as an etch mask to transfer this reverse tone pattern into the substrate.

In current practice, current SFIL-R formulations and processes are sensitive to the presence oxygen, have relatively low curing rates, high volatility, high viscosity, and low tensile strength, which can adversely affect the quality of the imprint mask. In light of these potential disadvantages, there is a need in the art for alternative SFIL-R formulations and SFIL-R processes that are less sensitive to the presence oxygen, have relatively high curing rates, low volatility, low viscosity and high tensile strength.

SUMMARY OF THE INVENTION

A first aspect of the present invention is a composition, comprising: one or more aromatic divinyl ethers; a photoacid generator; and a stabilizing/sensitizing agent.

A second aspect of the present invention is a method, comprising: forming on a substrate, a molding layer of a molding composition, the molding composition comprising one or more aromatic divinyl ethers; pressing a surface of a template into the molding layer, the template having a relief pattern on the surface, the molding layer filling voids in the relief pattern, the template not contacting the substrate; exposing the molding layer to actinic radiation, the actinic radiation converting the molding layer to a cured molding layer having thick and thin regions corresponding to the relief pattern; removing the template; filling the thin regions of the relief pattern with a backfill material; removing regions of the molding layer not protected by the backfill material to expose regions of the substrate; forming trenches in the exposed regions of the substrate; and removing any remaining molding layer and backfill material.

A third aspect of the present invention is a method, comprising: forming on a substrate, a transfer layer of a transfer composition; forming on the transfer layer, a molding layer of a molding composition, the molding composition comprising one or more aromatic divinyl ethers; pressing a surface of a template into the molding layer, the template having a relief pattern on the surface, the molding layer filling voids in the relief pattern, the template not contacting the transfer layer; exposing the molding layer to actinic radiation, the actinic radiation converting the molding layer to a cured molding layer having thick and thin regions corresponding to the relief pattern; removing the template; filling the thin regions of the relief pattern with a backfill material; removing regions of the molding layer and the transfer layer not protected by the backfill material to expose regions of the substrate; forming trenches in the exposed regions of the substrate; and removing any remaining molding layer, backfill material and transfer layer.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION OF THE INVENTION

Figure 1A:
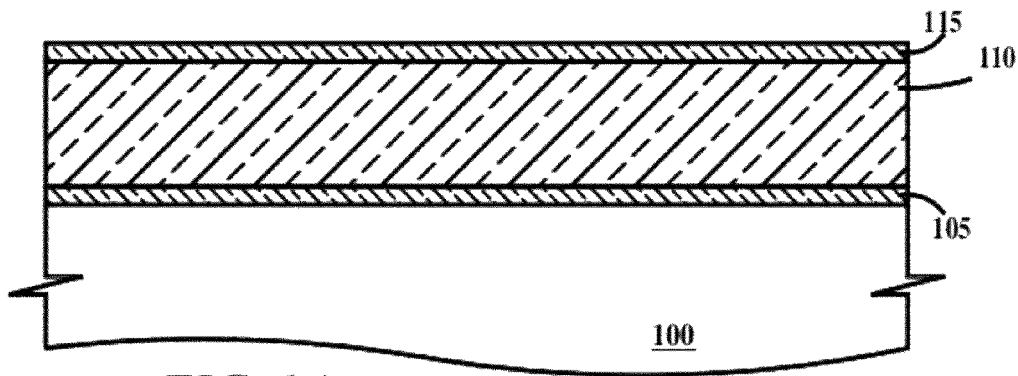
FIGS. 1A through 1L are cross-sectional drawings illustrating a SFIL process according to a first embodiment of the present invention.

FIGS. 1A through 1L are cross-sectional drawings illustrating a SFIL process according to embodiments of the present invention. In FIG. 1A formed on a top surface of a substrate 100 (or a layer of a material to be patterned on a substrate) is an optional first adhesion layer 105. Formed on a top surface of first adhesion layer 105 is a transfer layer 110. Formed on a top surface of transfer layer 110 is an optional second adhesion layer 115.

In one example, first adhesion layer 105 comprises hexamethyldisilazane (HMDS) or ethylsilicate, ethylorthosilicate, tetraalkoxysilane, aminoethylaminopropyltrialkoxysilane, aminopropyltrialkoxysilane, aminoethyltrialkoxysilane, tetraalkoxytitanate or combinations thereof.

First adhesion layer 105 need only be a few mono-layers thick and may be applied by spin application of a dilute solution of the adhesion promoting material(s) in a solvent, by vapor deposition or by incorporation into the material used to form transfer layer.

Transfer layer 110 is advantageously an organic polymer that etches rapidly in an oxygen or in a reducing-chemistry anisotropic plasma etch process and slowly in a halocarbon-based anisotropic plasma etch process. In one example, transfer layer 110 may comprise a thermosetting polymer, a thermoplastic polymer, a polyepoxy polymer, a polyamide polymer, a polyimide polymer, a polyurethane polymer, a polycarbonate polymer or a polyester polymer, and combinations thereof. Transfer layer 110 may be spin applied from a solution of the transfer layer material in an organic solvent. In the example that transfer layer 110 comprises polyimide, an adhesion promoter such as HMDS may be added to a solution of the polyimide polymer.

In one example, transfer layer 110 may comprise poly (vinylbenzoic acid) PVBA. PVBA can be prepared by conventional radical polymerization with 2,2'-azobisisobutyronitrile (AIBN) or benzoyl peroxide (BPO) as the initiator. PVBA has a high glass transition temperature, is soluble in 2-ethoxyethanol, 2-methoxyethanol, 1-methoxy-2-propanol, and aqueous base, and is insoluble in propylene glycol methyl ether acetate (PGMEA), cyclohexanone, and other common solvents. When transfer layer 110 comprises PVBA, the transfer layer may be spin applied from casting solution of PVBA in 2-ethoxyethanol, 2-methoxyethanol, 1-methoxy-2-propanol or combinations thereof.

Second adhesion layer 115 may comprise the adhesion promoter material represented by the structure (I):

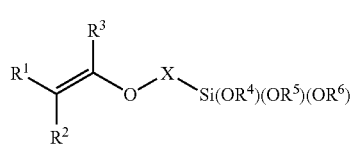

(I)

wherein X is a linking group selected from the group consisting of —C(O)O—, —C(O)—, —OC(O)—, —O—C(O)—C(O)—O—, NHC(O)—O—, —O—C(O)—O—, a linear or a branched alkylene having 1 to 7 carbon atoms, a cycloalkylene having 3 to 17 carbon atoms, an alkylcycloalkylene having 4 to 20 carbon atoms and a cycloalkylalkylene having 4 to 20 carbon atoms;

wherein each $R^1$, $R^2$, $R^3$, $R^4$, $R^5$, and $R^6$ ($R^1$-$R^6$) is independently selected from the group consisting of a hydrogen atom and a hydrocarbyl substituent with a primary, a secondary or a tertiary carbon attachment point, said hydrocarbyl group selected from the group consisting of an alkyl group, an alkenyl group, an alkynyl group, an aralkyl group, an alkaryl and an aryl group, each alkyl, alkenyl, alkynyl, aralkyl, alkaryl or aryl group having 1 to 20 carbon atom and each alkyl group of the aralkyl, or alkaryl groups may be linear, branched or cyclic; and any two $R^1$-$R^6$ in the same molecule may be linked to form at least one carbon ring containing 3 to 8 carbon atoms.

In one example, the adhesion promoter is O-(vinyloxybutyl)-H-(triethoxysilylpropyl)-urethane (manufactured by Gelest, Inc., 11 East Steel Road, Morrisville, Pa. 19067).

Figure 1B:
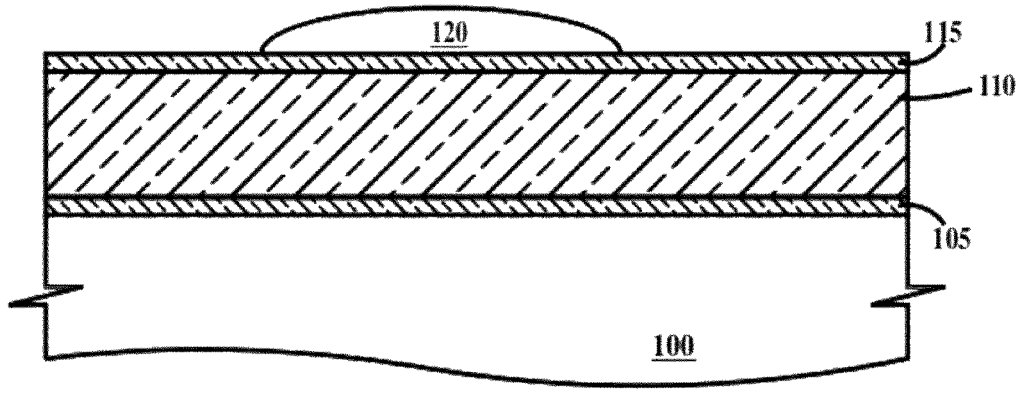

In FIG. 1B, a puddle of molding composition 120 is dispensed on a top surface of adhesion layer 115 (or on a top surface of transfer layer 110 if adhesion layer 115 is not used). In one example, puddle of molding composition 120 is applied using drops of between about 1 micron and about 200 microns in diameter.

In one example, the material of puddle of molding composition 120 comprises at least one aromatic divinyl ether, examples of which include 1,3-benzenedimethyl divinyl ether (structure II) and 1,3-benzenediethyl divinyl ether (structure III)

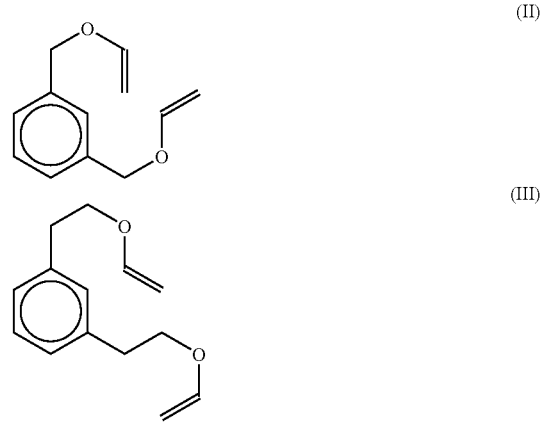

a photoacid generator (PAG), an optional stabilizer/sensitizer and an optional release agent.

The molding composition advantageously includes a PAG. PAGs are compounds that generate an acid upon exposure to radiation and will cause cross-linking or enhance cross-linking of the molding layer. In one example between about 0.2 parts to about 10 parts of PAG is added to the molding composition per 100 parts of molding material. Examples of suitable PAGs include but are not limited to:

sulfonium salts, examples of which include tolyldipenylsulfonium triflate, triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium, diphenylethylsulfonium chloride, and phenacyldimethylsulfonium chloride;

halonium salts, particularly iodonium salts, examples of which include diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphorsulfonate;

α,α'-bis-sulfonyl-diazomethanes, examples of which include bis(p-toluenesulfonyl)diazomethane, methylsulfonyl p-toluenesulfonyldiazomethane, 1-cyclohexylsulfonyl-1-(1,1dimethylethylsulfonyl) diazomethane, and bis(cyclohexylsulfonyl)diazomethane;

trifluoromethanesulfonate esters of imides and hydroxyimides, examples of which include (trifluoromethylsulfonyloxy)-bicyclo[2.2.1]hept-5-ene-2,3-dicarboximide (MDT);

nitrobenzyl sulfonate esters, examples of which include as 2-nitrobenzyl p-toluenesulfonate, 2,6-dinitrobenzyl p-toluenesulfonate, and 2,4-dinitrobenzyl p-trifluoromethylbenzenesulfonate;

sulfonyloxynaphthalimides, examples of which include N-camphorsulfonyloxynaphthalimide and N-pentafluorobenzenelsulfonyloxynaphthalimide;

pyrogallol derivatives (e.g., trimesylate of pyrogallol);
naphthoquinone-4-diazides;
alkyl disulfones;
s-triazine derivatives; and
miscellaneous sulfonic acid generators including t-butylphenyl-α-(p-toluenesulfonyloxy)-acetate, t-butyl-α-(p-toluenesulfonyloxy)acetate, and N-hydroxynaphthalimide dodecane sulfonate (DDSN), and benzoin tosylate.

Examples of PAGs advantageously soluble in molding compositions based on aromatic divinyl ether, are represented by structures represented by structures (IV) and (V):

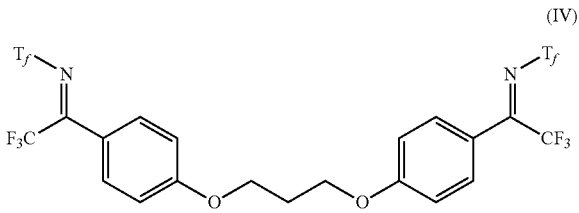
(IV)

wherein $T_f$=CF$_3$S(O)$_2$O—, and

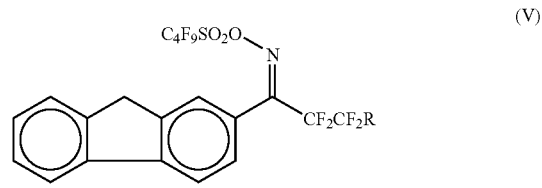
(V)

wherein R=CF$_2$CF$_2$CF$_2$CF$_2$H, CF$_3$, or CF$_2$CF$_3$.

Structure (IV) is sensitive to 313 nm UV radiation and is insensitive to i-line (365 nm UV radiation). However, addition of about 15% by weight (relative to the weight of any PAG in the molding composition) of one or more sensitizer/stabilizers, such as 9-anthracenemethanol (structure VI), or less than about 0.75% by weight (relative to the weight of aromatic divinyl ethers in the molding composition) of sensitizer/stabilizer added to the molding composition renders structure (IV) sensitive to 365 nm radiation.

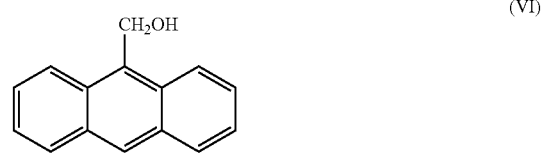
(VI)

Structure (V) is sensitive to 365 nm radiation and does not require a sensitizer. However a sensitizer/stabilizer may be added as a stabilizing agent for improved shelf-life.

Other suitable sensitizer/stabilizers may be used. In one example, the optional sensitizer/stabilizer may be a substituted 9-anthracenemethanol having the structure (VII), phenothiazine, or a substituted phenothiazine having the structure (VIII)

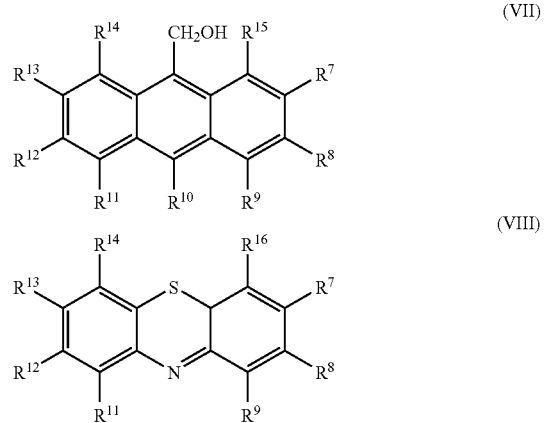

wherein each $R^7$, $R^8$, $R^9$, $R^{10}$, $R^{11}$, $R^{12}$, $R^{13}$, $R^{14}$, $R^{15}$ and $R^{16}$ ($R^7$-$R^{16}$) is independently selected from the group consisting of a hydrogen atom and a hydrocarbyl substituent with a primary, a secondary or a tertiary carbon attachment point, said hydrocarbyl group selected from the group consisting of an alkyl group having 1 to 20 carbon atoms, an alkenyl group having 1 to 20 carbon atoms, an alkynyl group having 1 to 20 carbon atoms, an aralkyl group having 1 to 20 carbon atoms, an alkaryl having 1 to 20 carbon atoms and an aryl group having 1 to 20 carbon atoms;

wherein the alkyl groups of the aralkyl and the alkaryl groups may be linear, branched or cyclic; and wherein any two $R^7$-$R^{15}$ in the same molecule may be linked to form the at least one carbon ring containing 3 to 8 carbon atoms. Phenothiazines should not be used with PAGs having structures V and VI or violent reactions may occur.

In order to facilitate release of the exposed molding layer from the template (as described infra), materials with a low surface energy such as fluorinated vinyl ethers and other fluorinated compounds can be optionally included in the molding composition in amounts ranging from about 1% by weight of the molding composition to about 20% by weight of the molding composition. An example of a fluorinated vinyl ether is vinyl 2,2,2-trifluoroethyl ether. Another example of a fluorinated vinyl ether is structure (IX):

(IX)

Other fluorinated vinyl ethers having the formula $(R^{17})(R^{18})=C(R^{19})OC_n(R^{20})(R^{21})(D)(R^{22})(R^{23})(R^{24})$, wherein D is a carbon atom, wherein n is 1, wherein $R^{17}$, $R^{18}$, $R^{19}$, $R^{20}$ and $R^{21}$ are H, and wherein $R^{22}$, $R^{23}$ and $R^{24}$ are fluorine groups.

Figure 1C:
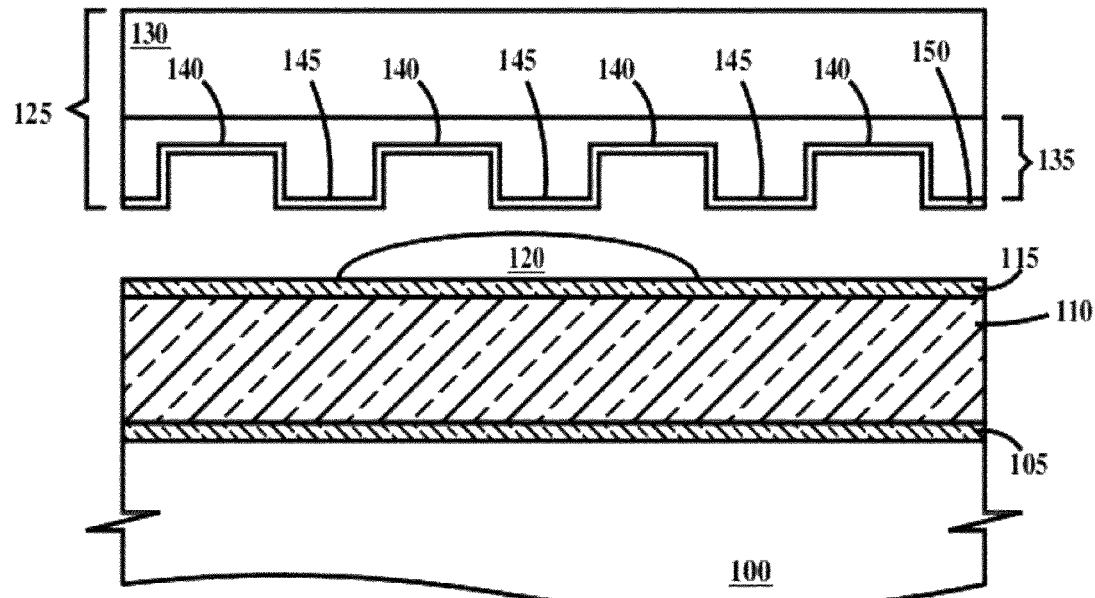

In FIG. 1C, a template 125 is aligned to substrate 100. Template 125 includes a support portion 130 and a mold portion 135. Both support 130 portion and mold portion 135 are transparent to the wavelength of radiation that molding composition 120 is sensitive to (in one example 313 nm and/or 365 nm). Mold portion 135 includes a relief pattern made up of trenches (or grooves) 140 and plateaus (or lands) 145. An optional release layer 150 may be applied to the bottom and sidewalls of trenches 140 and plateaus 145. Alternatively template 125 may be monolithic and support portion 130 and mold portion 135 integral with each other.

Figure 1D:
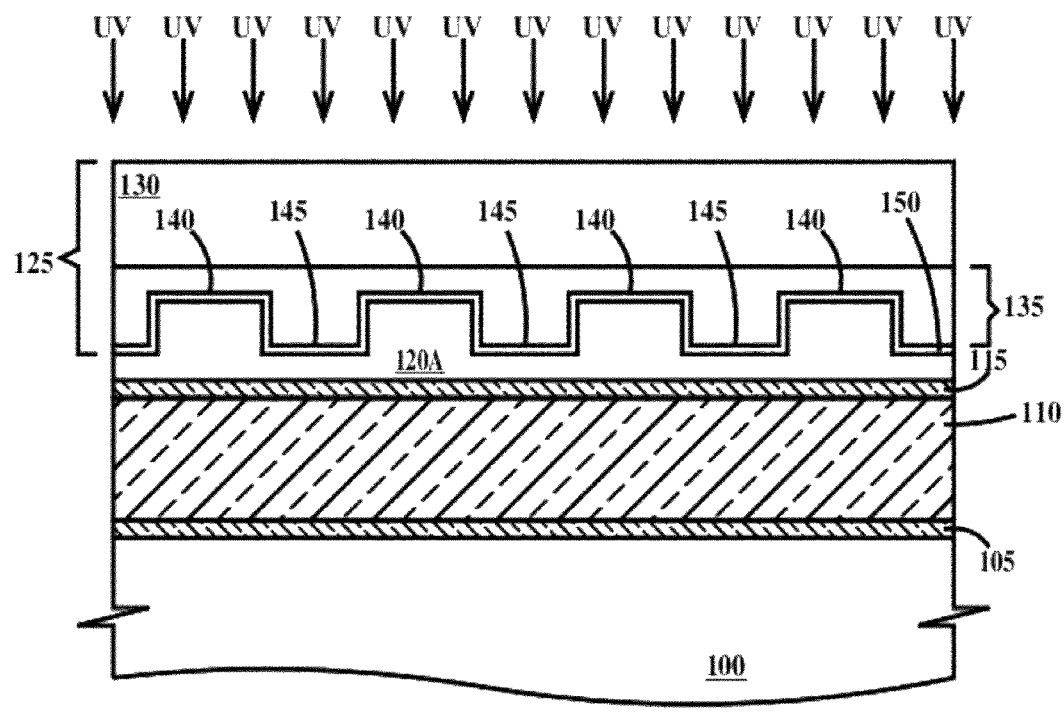

In FIG. 1D, template 125 is pressed with a low pressure (i.e., less than about 1 psi) toward substrate 100, and the puddle of molding composition 120 (see FIG. 1C) is spread out over second adhesion layer 115 (or transfer layer 110, if the second adhesion layer is not used), completely filling trenches 140 between plateaus 145 and forming an uncured molding layer 120A. Plateaus 145 do not touch second adhesion layer 115 (or transfer layer 110, if the second adhesion layer is not used) so molding layer 120A is a continuous layer having thick and thin regions. After exposure to actinic radiation (in this case UV light) and removal of template 125, uncured molding layer 120A is converted to a cured (i.e. cross-linked) molding layer 120B as depicted in FIG. 1E.

Figure 1E:
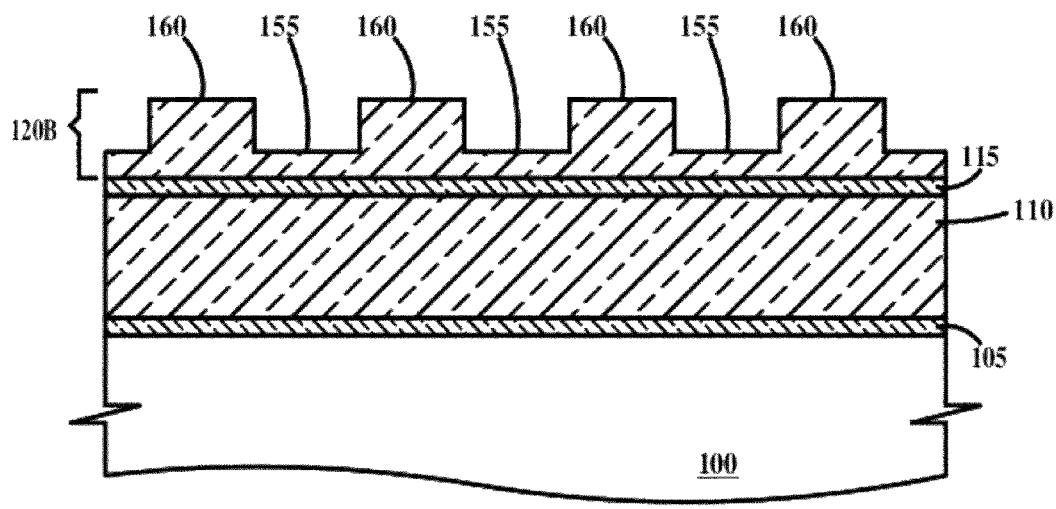

In FIG. 1E, cured molding layer comprises thin regions 155 and thick regions 160. When transfer layer 110 comprises a PVBA, second adhesion layer 115 comprises a material having a trialkoxysilyl moiety and a vinyl ether moiety (for example, structure I). The trialkoxysilyl moiety reacts with the carboxylic acid group of the transfer layer material and the vinyl group of the adhesion layer material polymerizes with the vinyl ether groups of the molding layer material to covalently link the transfer layer to the molding layer.

In a conventional SFIL process, a halocarbon-based anisotropic plasma etch would be performed at this point to remove thin regions 155 and expose adhesion layer 115 (or transfer layer 110). However, this is not required for the embodiments of the present invention, so the thickness of thin region 155 can be thicker than in conventional SFIL processes.

Figure 1F:
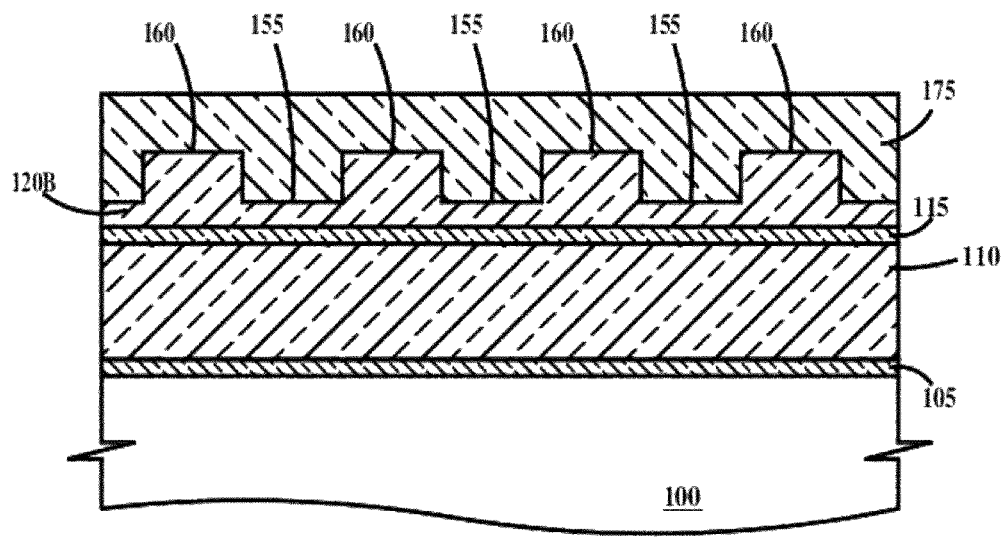

In FIG. 1F, a backfill layer 175 is formed over cured molding layer 120B, completely filling the space between thick regions 160 and covering both thin regions 155 and thick regions 160.

In a first example, backfill layer 175 may comprise siloxane polymers, spin-on-glass (SOG) or organo silicate glass (OSG) materials including silsesquioxane resins (low molecular weight polymers or oligomers) which may be represented by the formulas —$(SiO_2)n$-, —$(R'SiO_{3/2})n$-, —$(R'_2SiO)n$- and —$(R''Si_2O_3)n$-, wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms.

In a second example, backfill layer 175 may comprise any polymer containing at least 6 percent by weight of a metal such as silicon, germanium, tin, titanium or other Group IVA/IVB metals.

In a third example, backfill layer 175 comprises one or more silicon containing vinyl ethers such as $CH_2=CHOCH_2Si(CH_3)_3$, $CH_2=CHOCH_2CH_2Si(CH_3)_3$, $CH_2=CHOCH_2Si(CH_3)_2CH_2OCH=CH_2$, $CH_2=CHOCH_2Si(CH_3)_2OSi(CH_3)_2CH_2OCH=CH_2$, $CH_2=CHOCH_2Si(CH_3)_2CH_2CH_2OCH=CH_2$, $CH(CH_3)=CHOCH_2Si(CH_3)(CH_2OCH=CH(CH_3))$ $CH_2OCH=CH(CH_3)$, $CH_2=CHOCH_2CH_2Si(Si(CH_3)_3)_3$ and a suitable photoacid generator.

In a fourth example, backfill layer 175 comprises one or more silicon containing acrylates and a radical photoinitiator.

Figure 1G:
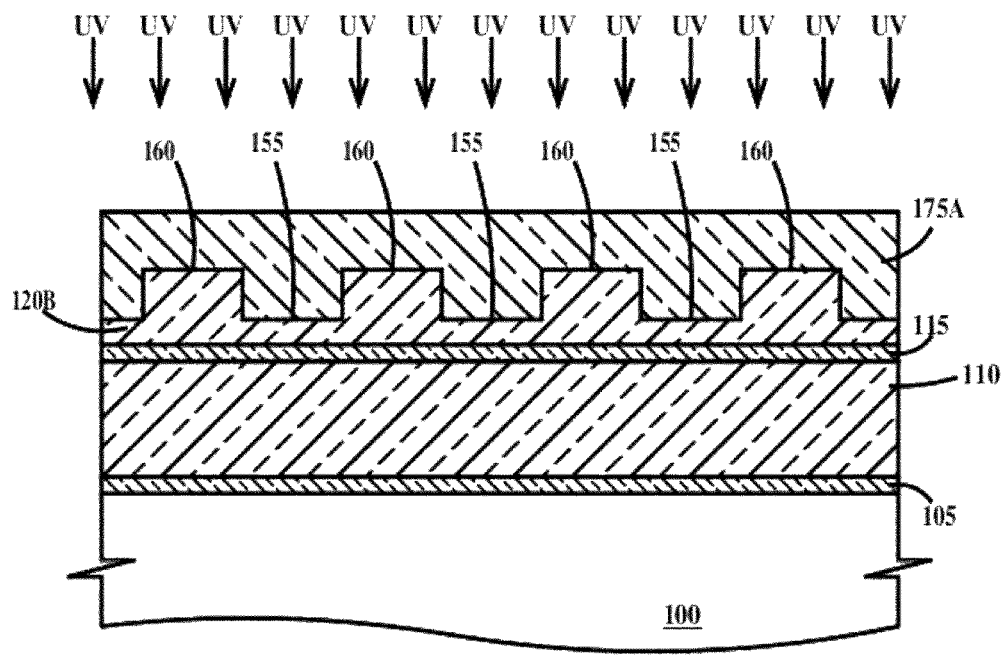

In FIG. 1G, an optional exposure (for backfill compositions comprising silicon containing vinyl ethers and a PAG, such as example 3 supra) actinic radiation is performed (in this case UV light) and backfill layer 175 (see FIG. 1F) is converted to a cured (i.e., cross-linked) backfill layer 175A.

Figure 1H:
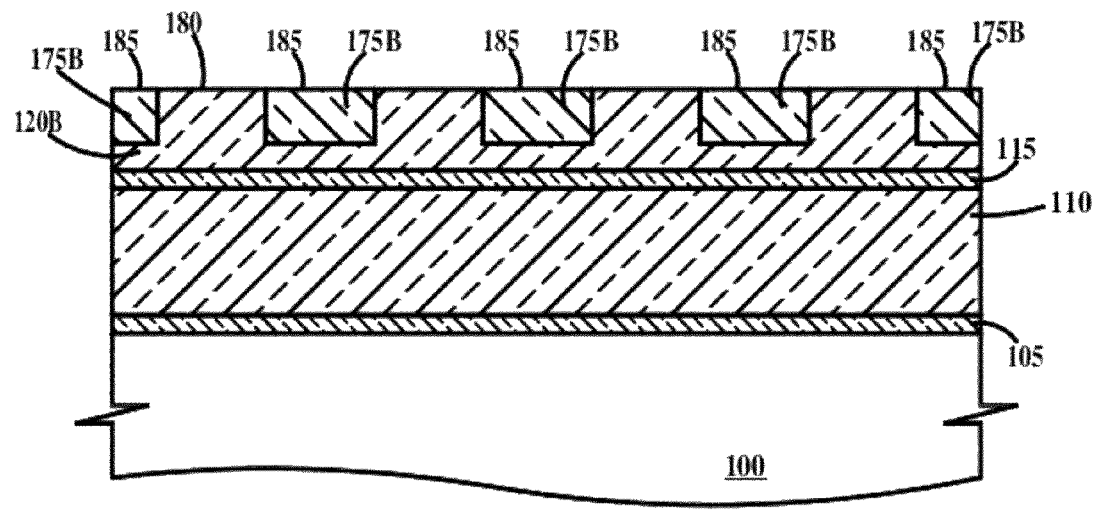

In FIG. 1H, cured backfill layer 175A (see FIG. 1G) or uncured backfill layer 175 (see FIG. 1F) is thinned and planarized to form etch barrier islands 175B of cured or uncured backfill material thereby exposing cured molding layer 120B between the etch barrier islands. A top surface 180 of cured molding layer 120B is coplanar with top surfaces 185 of etch barrier islands 175B, or top surface 180 may be recessed below tops surfaces 185. In one example, if etch barrier islands 175B are formed from cured molding material, then the thinning and planarizing may be accomplished by either CMP or a plasma etch. In one example, if etch barrier islands 175B are formed from uncured molding material, then the thinning and planarizing may be accomplished by a plasma etch.

Figure 1I:
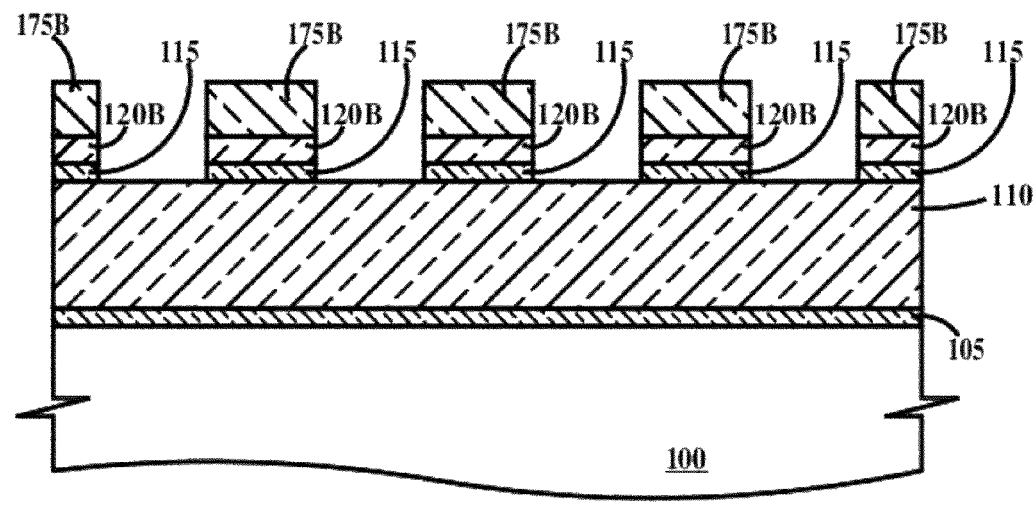

In FIG. 1I, an oxygen or reducing-chemistry anisotropic plasma etch process is performed to remove those portions of cured molding layer 120B and second adhesion layer 115 not protected by etch barrier islands 175B, thereby exposing the top surface of transfer layer 110.

Figure 1J:
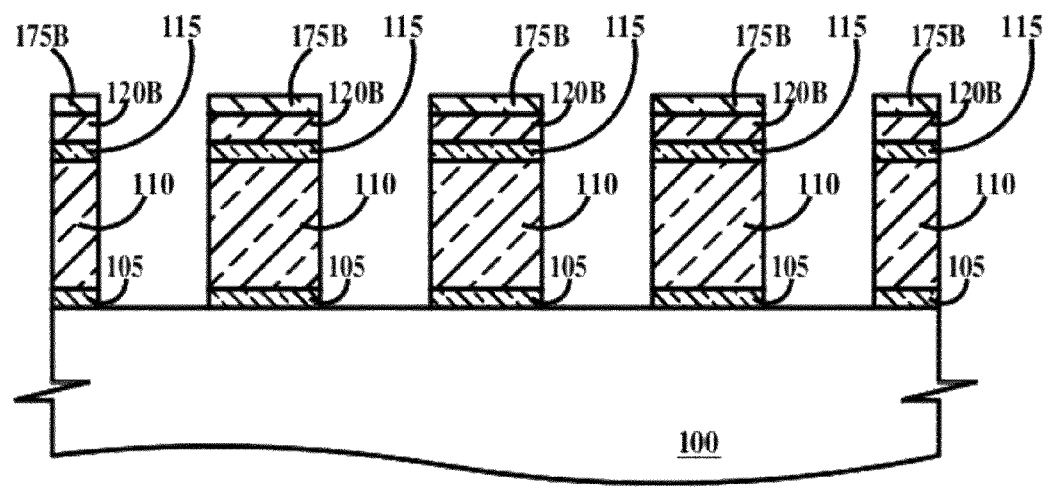

In FIG. 1J, the oxygen or reducing-chemistry anisotropic plasma etch process of FIG. 1I is continued, to remove those portions of transfer layer 110 and first adhesion layer 105 not protected by etch barrier islands 175B, thus exposing the top surface of substrate 100. Cured etch barrier islands 175B may be thinned by the oxygen or reducing-chemistry anisotropic plasma etch process (as shown in FIG. 1J), or alternatively the cured etch barrier islands may be removed by the oxygen or reducing-chemistry anisotropic plasma etch process.

Figure 1K:
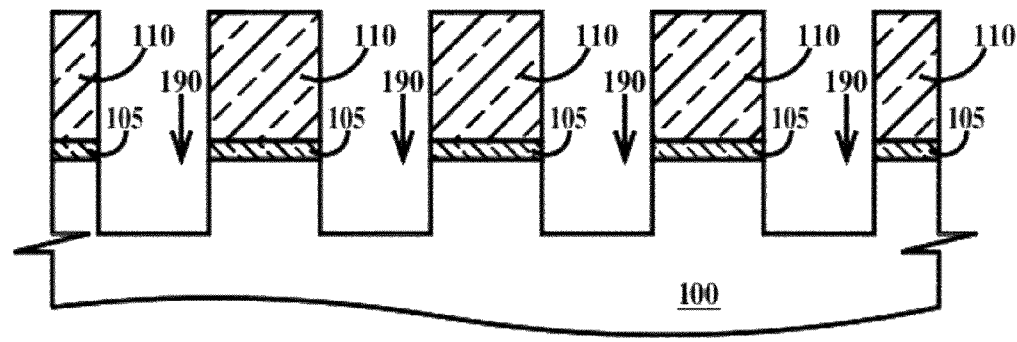

In FIG. 1K, a halocarbon-based anisotropic plasma etch is performed to etch trenches 190 into substrate 100 wherever substrate 100 is not protected by transfer layer 110. Any remnants of cured etch barrier islands 175B (see FIG. 1G) not removed by the oxygen or reducing-chemistry anisotropic plasma etch process of FIG. 1G are removed by the halocarbon-based anisotropic plasma etch.

Figure 1L:
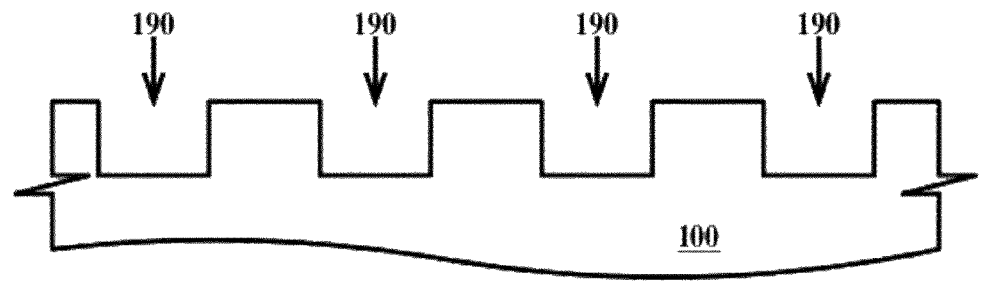

In FIG. 1L, the remaining transfer layer 110 and first adhesion layer 105 (see FIG. 1H) are removed using organic solvents such as 2-ethoxyethanol, 2-methoxyethanol, 1-methoxy-2-propanol, N-methylpyrrolidone or an aqueous base when transfer layer 110 is PVBA. If transfer layer 110 comprises a thermosetting polymer, a thermoplastic polymer, a polyepoxy polymer, a polyamide polymer, a polyimide polymer, a polyurethane polymer, a polycarbonate polymer or a polyester polymer, then plasma or acid removal processes are required.

Thus, the pattern of plateaus 145 of template 125 (see FIG. 1C) has been converted to a pattern of trenches 190 in substrate 100 (see FIG. 1I) in a negative imaging process in the first embodiment of the present invention without the use of a residual layer removal or pre-burning step.

Figure 2A:
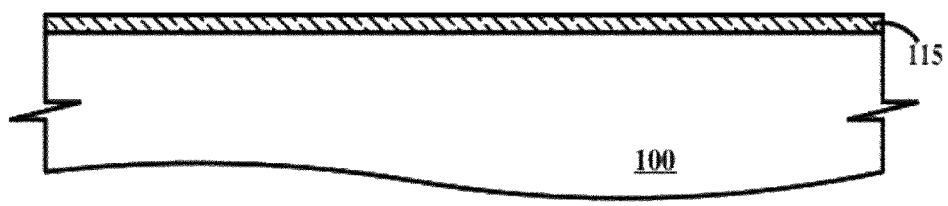
FIGS. 2A through 2K are cross-sectional drawings illustrating a SFIL process according to a second embodiment of the present invention.
Figure 2B:
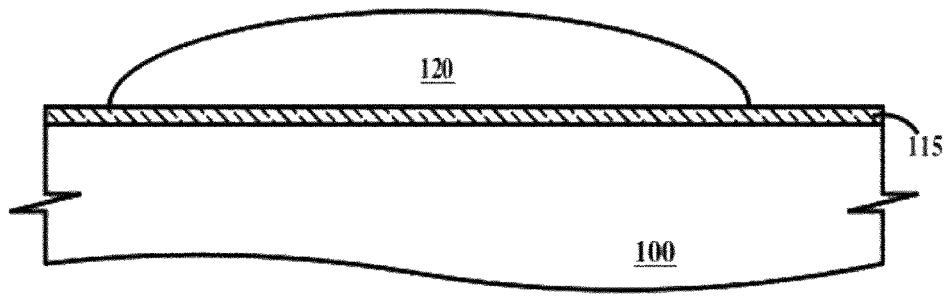
Figure 2C:
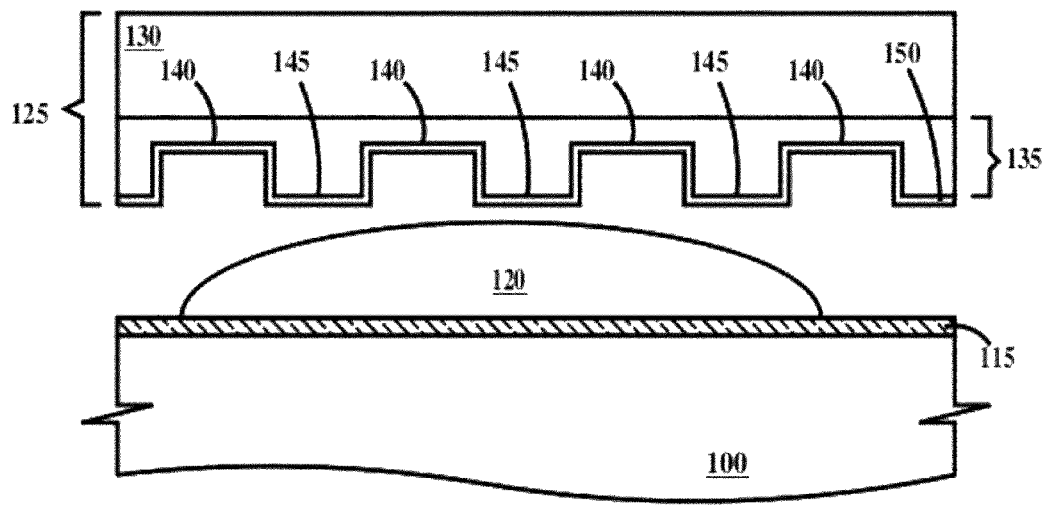
Figure 2D:
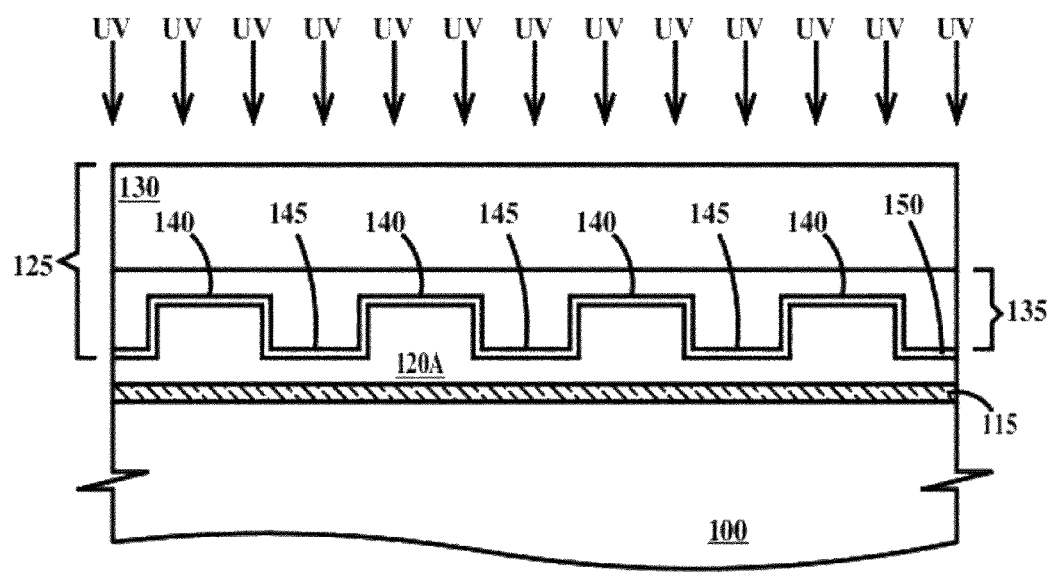
Figure 2E:
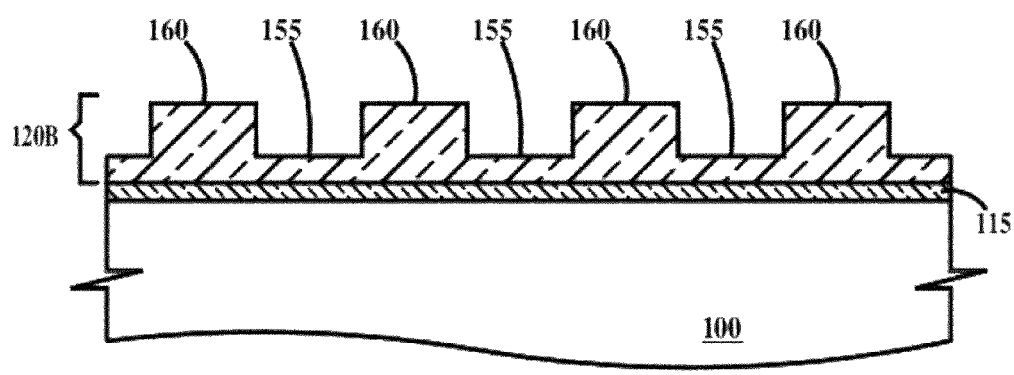
Figure 2F:
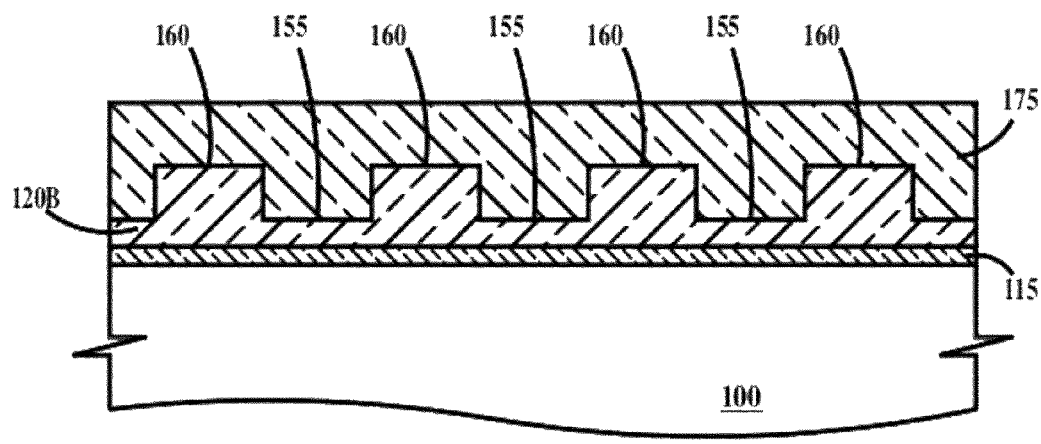
Figure 2G:
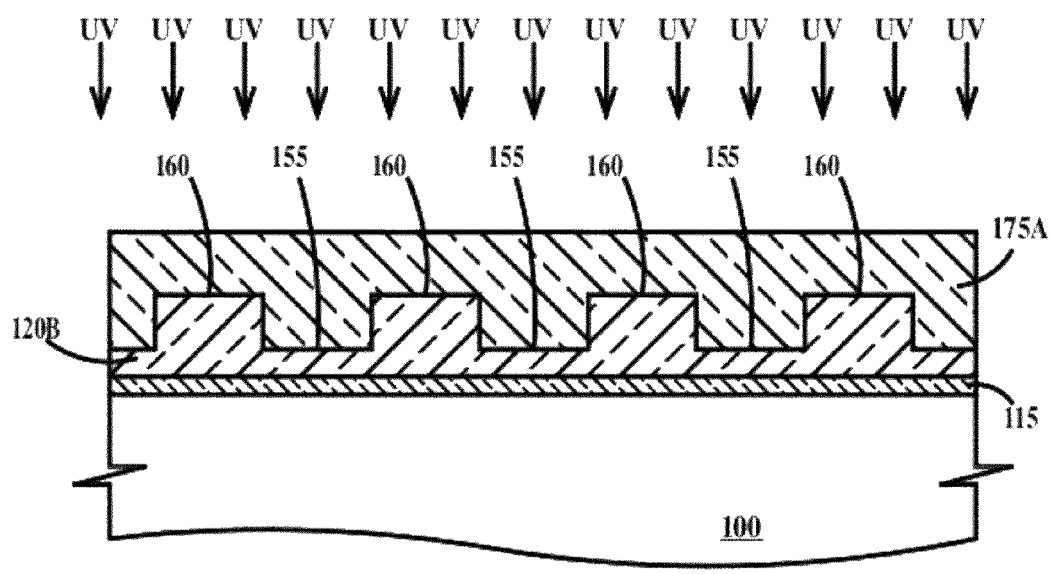
Figure 2H:
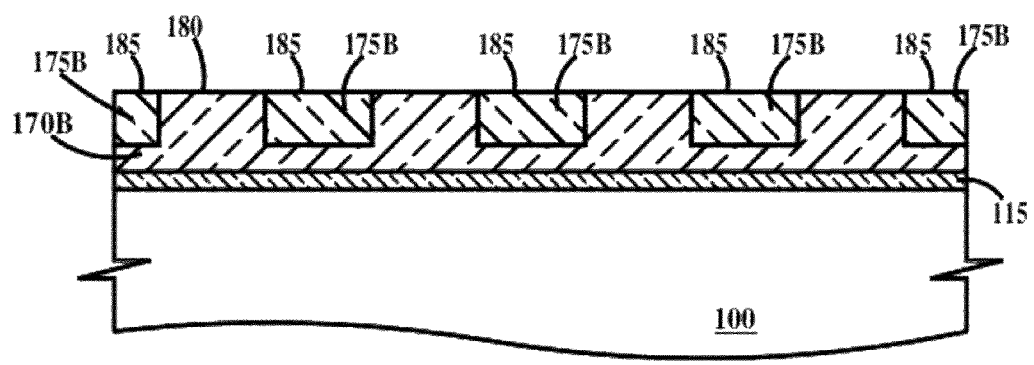

FIGS. 2A through 2K are cross-sectional drawings illustrating a SFIL process according to a second embodiment of the present invention. In FIGS. 2A through 2J, adhesion layer 115 is optional and its composition has been described supra. FIG. 2A is similar to FIG. 1A, FIG. 2B is similar to FIG. 1B, and FIG. 2C is similar to FIG. 1C, except there is no transfer layer or second adhesion layer and puddle of molding composition 120 is formed on the top surface of adhesion layer 115 or the top surface of substrate 100 if no adhesion layer is used. An advantage of using aromatic vinyl ethers in the molding composition is that a single layer of material can serve as both the molding layer and the transfer layer, eliminating the need to apply a separate aromatic transfer layer.

FIGS. 2D, 2E, 2F, 2G and 2H are similar to FIGS. 1D, 1E, 1F, 1G and 1H respectively. In reference to FIG. 2E, the triethoxysilyl moiety of adhesion layer 115 (structure I) reacts with the —OH group on the surface of substrate 100, and the vinyl ether moiety of structure (I) is co-polymerized into the molding layer 120B forming a covalent bond between the substrate and the cured layer.

Figure 2I:
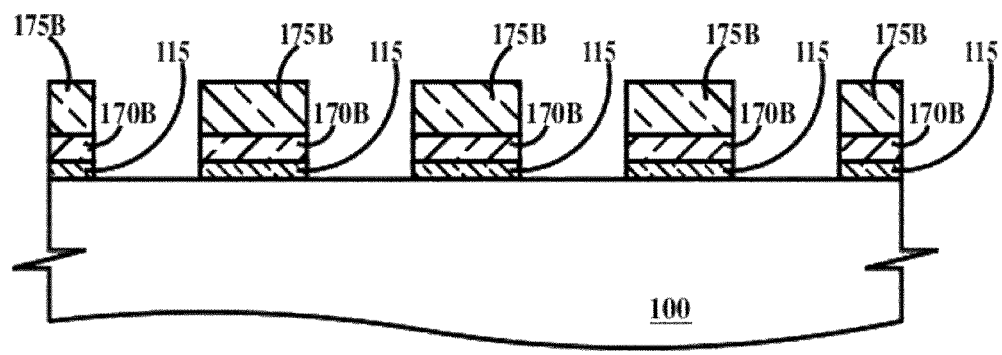

In FIG. 2I, an oxygen or reducing-chemistry anisotropic plasma etch process is performed to remove those portions of cured molding layer 120B and adhesion layer 115 not protected by etch barrier islands 175B, thus exposing the top surface of substrate 100.

Figure 2J:
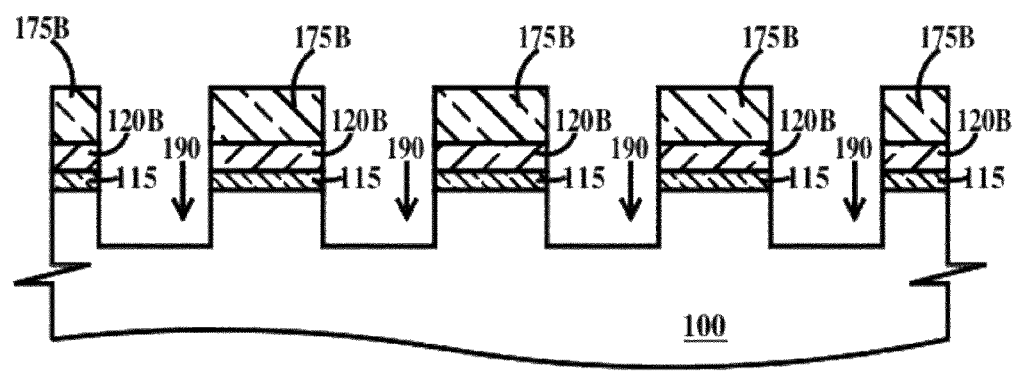

In FIG. 2J, a halocarbon RIE is performed to etch trenches 190 into substrate 100 wherever substrate 100 is not protected etch barrier islands 175B (or protected by cured molding layer 120B in the event all of the etch barrier island material is removed during the oxygen or reducing-chemistry anisotropic plasma etch process of FIG. 2I or during the current halocarbon-based anisotropic plasma etch). Even though etch barrier islands 175B are thinned in FIG. 2J, any remnants of etch barrier islands 175B not removed by the oxygen or reducing-chemistry anisotropic plasma etch process of FIG. 2I are removed by the halocarbon-based anisotropic plasma etch of FIG. 2J.

Figure 2K:
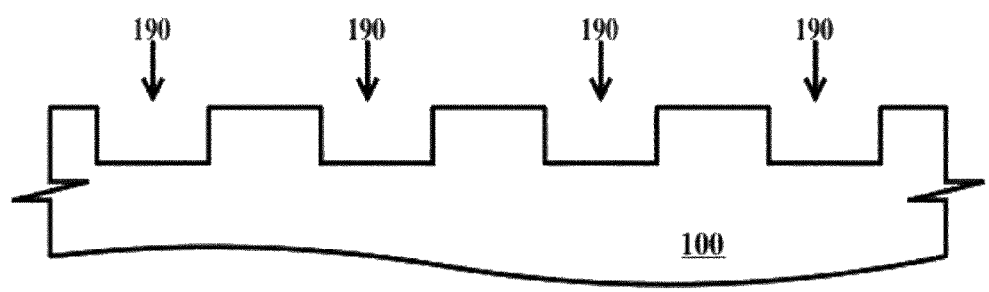

In FIG. 2K, the cured molding layer 120B (see FIG. 2J) is removed using a plasma or acid removal processes.

Thus, the pattern of trenches 140 of template 125 (see FIG. 2C) has been converted to a pattern of trenches 190 in substrate 100 (see FIG. 2L) in a negative imaging process in the second embodiment of the present invention without the use of a residual layer removal or a pre-burning step and without the use of a transfer layer.

EXPERIMENTAL RESULTS

Synthesis of 1,3-Benzenedimethyl Divinyl Ether

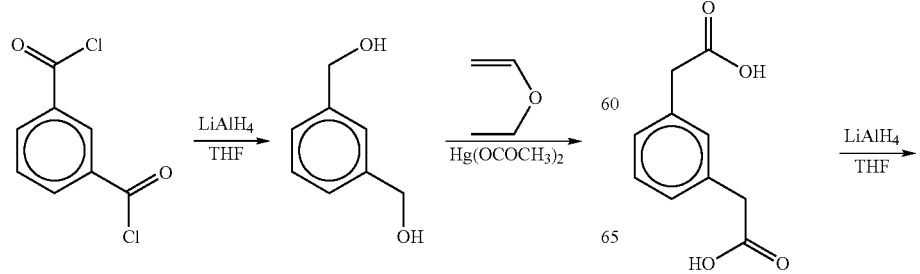

-continued

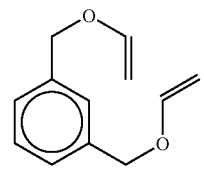

Synthesis of 1,3-Benzenedimethanol

To a two-liter, 3-necked round-bottomed flask equipped with a 500-ml constant pressure addition funnel, an overhead stirrer, a thermocouple and a nitrogen inlet was added 27 g (0.74 mol) of lithium aluminum hydride (95%) and 1000 ml of anhydrous tetrahydrofuran (THF). The addition funnel was charged with a solution of 100 g (0.493 mol) of isophthaloyl dichloride in 400 ml of anhydrous THF. Diacylchloride was added slowly over a period of 2 hours with cooling in an ice bath. Once addition was complete the ice bath was removed and the suspension allowed to reach room temperature for four hours at which time it was re-cooled and 200 ml of ethyl acetate was slowly added to decompose the remaining hydride. The addition funnel was recharged with 200 ml of 2M NaOH, which was then added slowly with vigorous stirring until the ensuing suspension became granular in appearance. The suspension was filtered and well washed with ethyl acetate. The combined filtrate and washings were then washed with brine, dried over anhydrous magnesium sulfate and evaporated on a rotary evaporator to yield 64 g (94%) of the title compound as a clear, colorless oil which solidified upon standing.

(2) Synthesis of 1,3-Benzenedimethyl Divinyl Ether

To a two-liter round bottomed flask equipped with a positive-pressure nitrogen inlet and a magnetic stir bar was added 64 g (0.46 mol) of 1,3-benzenedimethanol, 10 g (0.03 mol) of mercuric acetate and 1 liter of ethyl vinyl ether. The solution was stirred at room temperature for four days at which time it was washed well with saturated sodium bicarbonate solution and brine. The solution was then stirred for three days over 20 g of anhydrous magnesium sulfate (the reaction is driven to completion by stirring over the acidic magnesium sulfate), filtered and evaporated on a rotary evaporator. The resulting oil was distilled twice through an 8" Vigreux to yield 53 g (60%) of the title compound, boiling point=84° C. at 1 mm Hg. An additional 22 g of product was contaminated with the monovinyl ether intermediate.

Synthesis of 1,3-Benzenediethyl Divinyl Ether

-continued

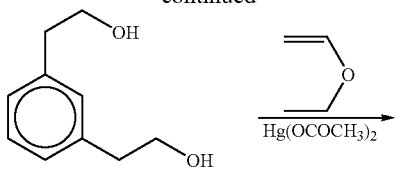

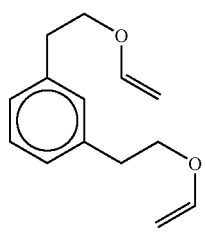

Synthesis of 1,3-Benzenediethanol

To a two-liter, 3-necked round-bottomed flask equipped with a 500-ml constant pressure addition funnel, an overhead stirrer, thermocouple and nitrogen inlet was added 16 g (0.42 mol) of lithium aluminum hydride (95%) and 800 ml of anhydrous THF. The addition funnel was charged with a solution of 40 g (0.21 mol) of 1,3-phenylenediacetic acid in 500 ml of anhydrous THF. The diacid was added slowly over a period of 2 hours with cooling in an ice bath. Once addition was complete, the ice bath was removed and the suspension allowed to reach room temperature overnight after which time it was re-cooled and 100 ml of ethyl acetate was slowly added to decompose the remaining hydride. The addition funnel was recharged with 200 ml of 2M NaOH, which was then added slowly with vigorous stirring until the ensuing suspension became granular in appearance. The suspension was filtered and well washed with ethyl acetate. The combined filtrate and washings were then washed with brine, dried over anhydrous magnesium sulfate and evaporated on a rotary evaporator to yield 21 g (62%) of the title compound as a clear, colorless oil.

1,3-Benzenediethyl Divinyl Ether

To a one-liter round bottomed flask equipped with a positive-pressure nitrogen inlet and a magnetic stir bar was added 21 g (0.13 mol) of 1,3-benzenediethanol, 4 g (0.03 mol) of mercuric acetate and 750 ml of ethyl vinyl ether. The solution was stirred at room temperature for four days at which time it was washed well with saturated sodium bicarbonate solution and brine. The solution was then stirred for three days over 20 g of anhydrous magnesium sulfate (the reaction is driven to completion by stirring over the acidic magnesium sulfate) filtered and evaporated on a rotary evaporator. The resulting oil was distilled twice through an 8" Vigreux to yield 12 g (43%) of the title compound, boiling point=98° C. at 1 mm Hg. An additional 8 g of product was contaminated with the monovinyl ether intermediate.

Imprinting Results

Structure (V) with R=$CF_2CF_3$ (0.03018 g) and 9-anthracenemethanol (0.0015 gram) were dissolved in 1.0015 g of 1,3-benzenedimethyl divinyl ether. A similar formulation was prepared by replacing 20 wt % of the 1,3-benzenedimethyl divinyl ether with 3,4,5,6-nonafluorohexyl vinyl ether. Both formulations were placed between two NaCl disks and were subjected to infrared (IR) analysis to determine the degree of curing as a function of ultraviolet (UV) light dose. 1,3-Benzenediethyl divinyl ether was found to cure as rapidly as 1,3-benzenedimethyl divinyl ether. Both aromatic divinyl ethers have only negligible volatility at room temperature, which is a desirable property as SFIL materials.

A cured mixture of 1,3-benzenedimethyl divinyl ether and structure (V) with R=$CF_2CF_3$ was etched in an anisotropic fluorocarbon ($CF_4$) plasma at 1.23 nm/sec, comparable to poly(4-vinylbenzoic acid) (1.3 nm/sec), while a cured aliphatic divinyl ether showed a faster etch rate of 1.65 nm/sec.

Figure 3:
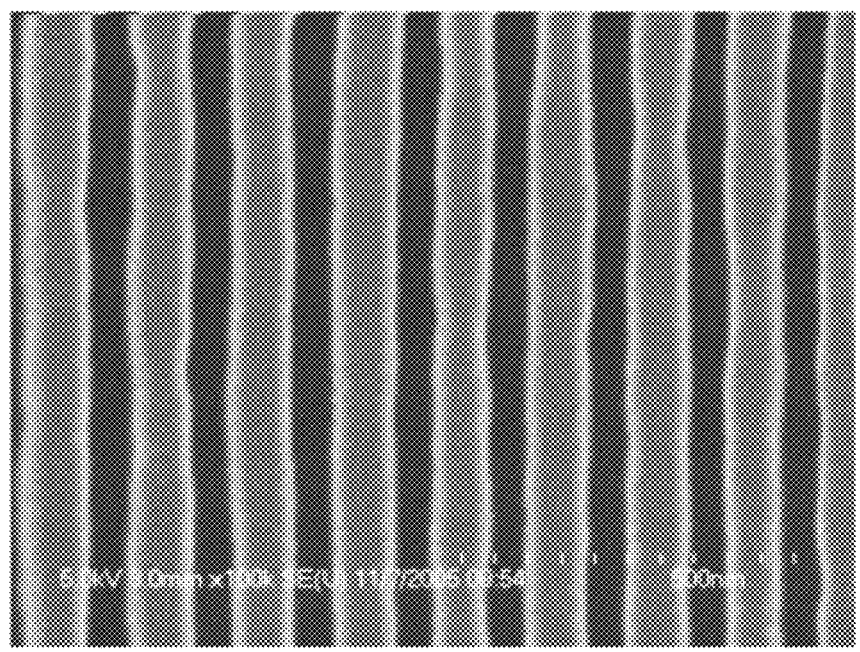
FIG. 3 is a scanning electron microscope image of an SFIL imprint image formed according to the embodiments of the present invention.

Imprinting of the 1,3-benzenedimethyl divinyl ether formulations with and without fluorinated vinyl ether hand-dispensed on an Molecular Imprint tool was successful, generating 50 nm 1:1 line space patterns with an aspect ratio of about two as illustrated in FIG. 3.

FIG. 3 is a scanning electron microscope image of an SFIL imprint image formed according to the embodiments of the present invention. The 1,3-benzenedimethyl divinyl ether formulations had a viscosity of about 1.6 cP and 50 nm wide line/space pairs were imprinted greater than 90 nm deep.

Thus, the embodiments of the present invention provide alternative SFIL-R formulations and SFIL-R process that are less sensitive to the presence oxygen, have relatively high curing rates, low volatility, low viscosity and high tensile strength.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    forming on a substrate a molding layer of a molding composition, said molding composition comprising one or more aromatic divinyl ethers;
    pressing a surface of a template into said molding layer, said template having a relief pattern on said surface, said molding layer filling voids in said relief pattern, said template not contacting said substrate;
    exposing said molding layer to actinic radiation, said actinic radiation converting said molding layer to a cured molding layer having thick and thin regions corresponding to said relief pattern;
    after exposing said molding layer to said actinic radiation, removing said template from said cured molding layer;
    after removing said template, filling said thin regions of said relief pattern with a backfill material;
    removing regions of said molding layer not protected by said backfill material to expose regions of said substrate;
    forming trenches in said exposed regions of said substrate; and
    after forming said trenches, removing any remaining molding layer and backfill material.

2. The method of claim 1, wherein said aromatic divinyl ethers are selected from the group consisting of

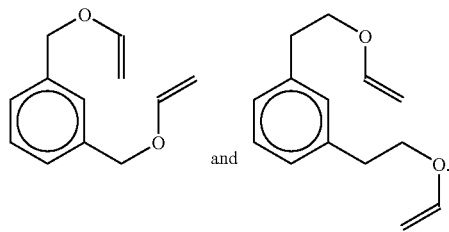

and

3. The method of claim 1, further including forming an adhesion layer between said substrate and said molding layer.

4. The method of claim 3, wherein said adhesion layer comprises a material selected from the group consisting of
(1) O-(vinyloxybutyl)-H-(triethoxysilylpropyl)-urethane,
(2) materials having both a trialkoxysilyl moiety and a vinyl ether moiety,
(3)

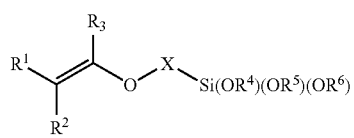

wherein X is a linking group selected from the group consisting of —C(O)O—, —C(O)—, —OC(O)—, —O—C(O)—C(O)—O—, NHC(O)—O—, —O—C(O)—O—, a linear or a branched alkylene having 1 to 7 carbon atoms, a cycloalkylene having 3 to 17 carbon atoms, an alkylcycloalkylene having 4 to 20 carbon atoms and a cycloalkylalkylene having 4 to 20 carbon atoms;

wherein each $R^1$, $R^2$, $R^3$, $R^4$, $R^5$, and $R^6$ ($R^1$-$R^6$) is independently selected from the group consisting of a hydrogen atom and a hydrocarbyl substituent with a primary, a secondary or a tertiary carbon attachment point, said hydrocarbyl group selected from the group consisting of an alkyl group, an alkenyl group, an alkynyl group, an aralkyl group, an alkaryl and an aryl group, wherein each alkyl, alkenyl, alkynyl, aralkyl, alkaryl or aryl group has 1 to 20 carbon atoms and each alkyl group of the aralkyl, or alkaryl groups may be linear, branched or cyclic; and any two $R^1$-$R^6$ in the same molecule may be linked to form the at least one carbon ring containing 3 to 8 carbon atoms, and (4) combinations thereof.

5. The method of claim 1, wherein said molding composition further includes:
a photoacid generator; and
a stabilizing/sensitizing agent.

6. The method of claim 5, wherein said photoacid generator is selected from the group consisting of sulfonium salts, tolyldipenylsulfonium triflate, triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium, diphenylethylsulfonium chloride, and phenacyldimethylsulfonium chloride, halonium salts, iodonium salts, diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphorsulfonate, α, α' -bis-sulfonyl -diazomethanes, bis(p-toluenesulfonyl)diazomethane, methylsulfonyl p-toluenesulfonyldiazomethane, 1-cyclohexylsulfonyl-(1-(1,1-dimethylethylsulfonyl) diazomethane, and bis(cyclohexylsulfonyl)diazomethane, trifluoromethanesulfonate esters of imides and hydroxyimides, (trifluoromethylsulfonyloxy)-bicyclo[2.2.1]hept-5-ene-2,3-dicarboximide (MDT), nitrobenzyl sulfonate esters, 2-nitrobenzyl p-toluenesulfonate, 2,6-dinitrobenzyl p-toluenesulfonate, and 2,4-dinitrobenzyl p-trifluoromethylbenzenesulfonate, sulfonyloxynaphthalimides, N-camphorsulfonyloxynaphthalimide and N-pentafluorophenylsulfonyloxynaphthalimide, pyrogallol derivatives, trimesylate of pyrogallol, naphthoquinone-4-diazides, alkyl disulfones, s-triazine derivatives, sulfonic acid generators, t-butylphenyl-α-(p-toluenesulfonyloxy)-acetate, t-butyl-α-(p-toluenesulfonyloxy)acetate, N-hydroxy-naphthalimide dodecane sulfonate (DDSN), benzoin tosylate,

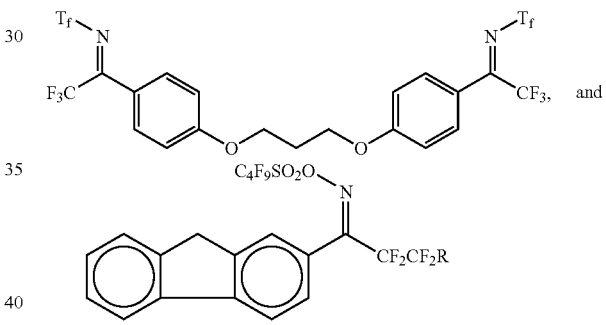

wherein $T_f$=$CF_3S(O)_2O$— and wherein $R$=$CF_2CF_2CF_2CF_2H$, $CF_3$, or $CF_2CF_3$.

7. The method of claim 5, wherein said stabilizing/sensitizing agent is selected from the group consisting of

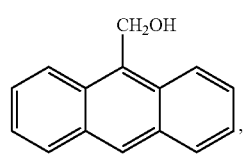

substituted 9-anthracenemethanols, phenothiazine, substituted phenothiazines,

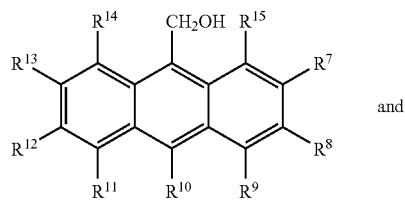

and

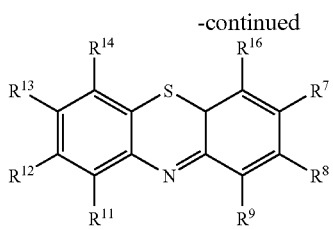

wherein each $R^7$, $R^8$, $R^9$, $R^{10}$, $R^{11}$, $R^{12}$, $R^{13}$ $R^{14}$, $R^{15}$ and $R^{16}$($R^7$-$R^{16}$) is independently selected from the group consisting of a hydrogen atom and a hydrocarbyl substituent with a primary, a secondary or a tertiary carbon attachment point, said hydrocarbyl group selected from the group consisting of an alkyl group having 1 to 20 carbon atoms, an alkenyl group having 1 to 20 carbon atoms, an alkynyl group having 1 to 20 carbon atoms, an aralkyl group having 1 to 20 carbon atoms, an alkaryl having 1 to 20 carbon atoms and an aryl group having 1 to 20 carbon atoms;

wherein the alkyl groups of the aralkyl and the alkaryl groups may be linear, branched or cyclic; and wherein any two $R^7$-$R^{15}$ in the same molecule may be linked to form the at least one carbon ring containing 3 to 8 carbon atoms.

8. The method of claim 1, said molding composition further including a fluorinated release agent selected from the group consisting of vinyl 2,2,2-trifluoroethyl ether,

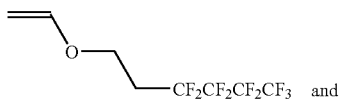

$(R^{17})(R^{18})=C(R^{19})OC_n(R^{20})(R^{21})(D)(R^{22})(R^{23})(R^{24})$,
wherein D is a carbon atom, wherein n is 1, wherein $R^{17}$, $R^{18}$, $R^{19}$, $R^{20}$ and $R^{21}$ are H, and
wherein $R^{22}$, $R^{23}$ and $R^{24}$ are fluorine groups.

9. The method of claim 1, wherein said backfill material is selected from the group consisting of:
(1) a siloxane polymer, spin-on-glass, spin-on-organo-silicate glass silsesquioxanes having the formulas —(SiO$_2$)n-, —(R'SiO$_{3/2}$)n-, —(R'$_2$SiO)n- and —(R"Si$_2$O$_3$)n-, wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms;
(2) a polymer containing at least 6 percent by weight of silicon, germanium, tin, titanium or other Group IVA/IVB metals;
(3) one or more of CH$_2$=CHOCH$_2$Si(CH$_3$)$_3$, CH$_2$=CHOCH$_2$CH$_2$Si(CH$_3$)$_3$, CH$_2$=CHOCH$_2$Si(CH$_3$)$_2$CH$_2$OCH=CH$_2$, CH$_2$=CHOCH$_2$Si(CH$_3$)$_2$OSi(CH$_3$)$_2$CH$_2$OCH=CH$_2$, CH$_2$=CHOCH$_2$CH$_2$Si(CH$_3$)$_2$ CH$_2$CH$_2$OCH=CH$_2$, CH(CH$_3$)=CHOCH$_2$Si(CH$_3$)(CH$_2$OCH=CH(CH$_3$))CH$_2$OCH=CH(CH$_3$), CH$_2$=CHOCH$_2$CH$_2$Si(Si(CH$_3$)$_3$)$_3$, other silicon containing vinyl ethers and a photoacid generator; and
(4) silicon containing acrylates and a radical photoinitiator.

10. A method, comprising:
forming on a substrate, a transfer layer of a transfer composition;
forming on said transfer layer a molding layer of a molding composition, said molding composition comprising one or more aromatic divinyl ethers;
pressing a surface of a template into said molding layer, said template having a relief pattern on said surface, said molding layer filling voids in said relief pattern, said template not contacting said transfer layer;
exposing said molding layer to actinic radiation, said actinic radiation converting said molding layer to a cured molding layer having thick and thin regions corresponding to said relief pattern;
after exposing said molding layer to said actinic radiation, removing said template from said cured molding layer;
after removing said template, filling said thin regions of said relief pattern with a backfill material;
removing regions of said molding layer and said transfer layer not protected by said backfill material to expose regions of said substrate;
forming trenches in said exposed regions of said substrate; and
after said forming said trenches, removing any remaining molding layer, backfill material and transfer layer.

11. The method of claim 10, wherein said transfer composition comprises a thermosetting polymer, a thermoplastic polymer, a polyepoxy polymer, a polyamide polymer, a polyimide polymer, a polyurethane polymer, a polycarbonate polymer, a polyester polymer, poly(vinylbenzoic acid) or combinations thereof.

12. The method of claim 10, further including:
forming a first adhesion layer between said substrate and said transfer layer; or
forming a second adhesion layer between said transfer layer and said molding layer; or
forming both a first adhesion layer between said substrate and said transfer layer and forming a second adhesion layer between said transfer layer and said molding layer.

13. The method of claim 12 wherein
(1) said adhesion layer comprises a material selected from the group consisting of hexamethyldisilazane (HMDS) or ethylsilicate, ethylorthosilicate, tetraalkoxysilane, aminoethylaminopropyltrialkoxysilane, aminopropyltrialkoxysilane, aminoethyltrialkoxysilane, tetraalkoxytitanate or combinations thereof; and
(2) wherein said second adhesion layer comprises O-(vinyloxybutyl)-H-(triethoxysilylpropyl)-urethane or

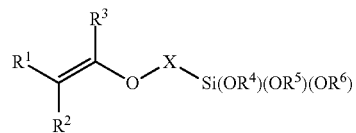

wherein X is a linking group selected from the group consisting of —C(O)O—, —C(O)—, —OC(O)—, —O—C(O)—C(O)—O—, NHC(O)—O —, —O—C(O)—O—, a linear or a branched alkylene having 1 to 7 carbon atoms, a cycloalkylene having 3 to 17 carbon atoms, an alkylcycloalkylene having 4 to 20 carbon atoms and a cycloalkylalkylene having 4 to 20 carbon atoms,
wherein each $R^1$, $R^2$, $R^3$, $R^4$, $R^5$, and $R^6$($R^1$-$R^6$) is independently selected from the group consisting of a hydrogen atom and a hydrocarbyl substituent with a primary, a secondary or a tertiary carbon attachment point, said hydrocarbyl group selected from the group consisting of an alkyl group, an alkenyl group, an alkynyl group, an aralkyl group, an alkaryl and an aryl group, wherein each alkyl, alkenyl, alkynyl, aralkyl, alkaryl or aryl group has 1 to 20 carbon atoms and each alkyl group of the aralkyl, or alkaryl groups may be linear, branched or cyclic, and wherein any two $R^1$-$R^6$ in the same molecule may be linked to form the at least one carbon ring containing 3 to 8 carbon atoms.

14. The composition of claim 10, wherein said aromatic divinyl ethers are selected from the group consisting of

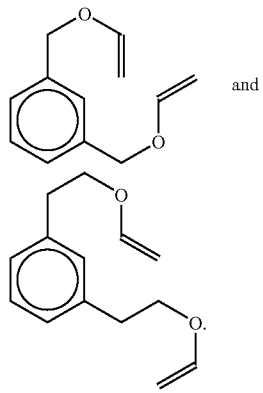
and

15. The method of claim 10, wherein said molding composition further includes:
    a photoacid generator; and
    a stabilizing/sensitizing agent.

16. The method of claim 15, wherein said photoacid generator is selected from the group consisting of sulfonium salts, tolyldipenylsulfonium triflate, triphenylsulfonium erfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium, diphenylethylsulfonium chloride, phenacyldimethylsulfonium chloride, halonium salts, iodonium salts, diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, bis-(t-butylphenyl)-iodonium camphorsulfonate, α, α'-bis-sulfonyl -diazomethanes, bis(p-toluenesulfonyl)diazomethane, methylsulfonyl p-toluenesulfonyldiazomethane, 1-cyclohexylsulfonyl-1-(1,1-dimethylethylsulfonyl) diazomethane, bis(cyclohexylsulfonyl)diazomethane, trifluoromethanesulfonate esters of imides hydroxyimides, (trifluoromethylsulfonyloxy)-bicyclo[2.2.1]hept-5-ene-2,3-dicarboximide (MDT), (5)nitrobenzyl sulfonate esters, 2-nitrobenzyl p-toluenesulfonate, 2,6-dinitrobenzyl p-toluenesulfonate, 2,4-dinitrobenzyl p-trifluoromethylbenzenesulfonate, sulfonyloxynaphthalimides, N-camphorsulfonyloxynaphthalimide N-pentafluorophenylsulfonyloxynaphthalimide, pyrogallol derivatives, trimesylate of pyrogallol, naphthoquinone-4-diazides, alkyl disulfones, s-triazine derivatives, sulfonic acid generators, i t-butylphenyl-α-(p-toluenesulfonyloxy)-acetate, t-butyl-α-(p-toluenesulfonyloxy)acetate, N-hydroxy-naphthalimide dodecane sulfonate (DDSN), benzoin tosylate,

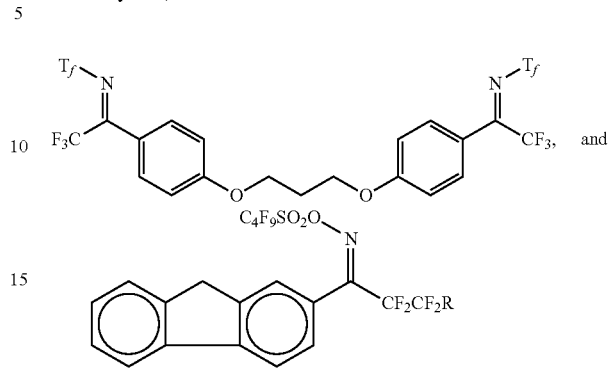
and wherein $T_f$=$CF_3S(O)_2O$— and wherein R=$CF_2CF_2CF_2CF_2H$, $CF_3$, or $CF_2CF_3$.

17. The method of claim 15, wherein said stabilizing/sensitizing agent is selected from the group consisting of

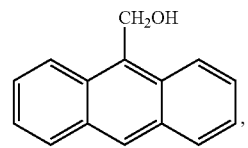
, substituted 9-anthracenemethanols, phenothiazine, substituted phenothiazines,

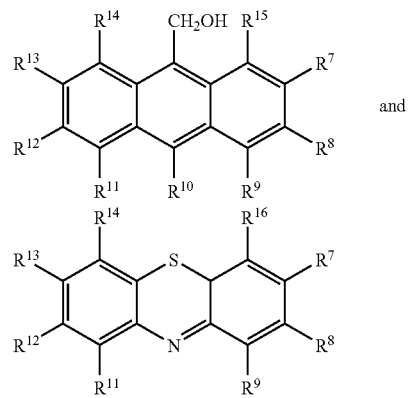
and wherein each $R^7$, $R^8$, $R^9$, $R^{10}$, $R^{11}$, $R^{12}$, $R^{13}$, $R^{14}$, $R^{15}$, and $R^{16}$($R^7$- $R^{16}$) is independently selected from the group consisting of a hydrogen atom and a hydrocarbyl substituent with a primary, a secondary or a tertiary carbon attachment point, said hydrocarbyl group selected from the group consisting of an alkyl group having 1 to 20 carbon atoms, an alkenyl group having 1 to 20 carbon atoms, an alkynyl group having 1 to 20 carbon atoms, an aralkyl group having 1 to 20 carbon atoms, an alkaryl having 1 to 20 carbon atoms and an aryl group having 1 to 20 carbon atoms;

wherein the alkyl groups of the aralkyl and the alkaryl groups may be linear, branched or cyclic; and wherein any two R⁷-R¹⁵ in the same molecule may be linked to form at least one carbon ring containing 3 to 8 carbon atoms.

18. The method of claim 10, said molding composition further including a fluorinated release agent selected from the group consisting of vinyl 2,2,2-trifluoroethyl ether,

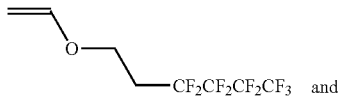

(R¹⁷)(R¹⁸)=(R¹⁹)OC$_n$(R²⁰)(R²¹)(D)(R²²)(R²³)(R²⁴),
wherein D is a carbon atom, wherein n is 1, wherein R¹⁷, R¹⁸, R¹⁹, R²⁰ and R²¹ are H, and
wherein R²², R²³ and R²⁴ are fluorine groups.

19. The method of claim 10, wherein said backfill material is selected from the group consisting of:
(1) a siloxane polymer, spin-on-glass, spin-on-organo-silicate glass silsesquioxanes having the formulas —(SiO₂)n-, a-(R'SiO$_{3/2}$)n-, —(R'₂SiO)n- and —(R"Si₂O₃)n-, wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms;
(2) a polymer containing at least 6 percent by weight of silicon, germanium, tin, titanium or other Group IVA/IVB metals;
(3) one or more of CH₂=CHOCH₂Si(CH₃)₃, CH₂=CHOCH₂CH₂Si(CH₃)₃, CH₂=CHOCH₂Si(CH₃)₂CH₂OCH=CH₂, CH₂=CHOCH₂Si(CH₃)₂OSi(CH₃)₂CH₂OCH=CH₂, CH₂=CHOCH₂CH₂Si(CH₃)₂ CH₂CH₂OCH=CH₂, CH(CH₃)=CHOCH₂Si(CH₃)(CH₂OCH=CH(CH₃))CH₂OCH=CH(CH₃), CH₂=CHOCH₂CH₂Si(Si(CH₃)₃)₃, other silicon containing vinyl ethers and a photoacid generator; and
(4) silicon containing acrylates and radical photoinitiator.

20. A method, comprising:
forming a first adhesion layer on a substrate;
forming on said adhesion layer, a transfer layer of a transfer composition;
forming a second adhesion layer on said transfer layer;
forming on said second adhesion layer a molding layer of a molding composition, said molding composition comprising one or more aromatic divinyl ethers;
pressing a surface of a template into said molding layer, said template having a relief pattern on said surface, said molding layer filling voids in said relief pattern, said template not contacting said transfer layer;
exposing said molding layer to actinic radiation, said actinic radiation converting said molding layer to a cured molding layer having thick and thin regions corresponding to said relief pattern;
after exposing said molding layer to said actinic radiation, removing said template from said cured molding layer;
after removing said template, filling said thin regions of said relief pattern with a backfill material;
removing regions of said molding layer and said transfer layer not protected by said backfill material to expose regions of said substrate;
forming trenches in said exposed regions of said substrate;
after forming said trenches, removing any remaining molding layer, backfill material and transfer layer;
wherein said transfer composition comprises a thermosetting polymer, a thermoplastic polymer, a polyepoxy polymer, a polyamide polymer, a polyimide polymer, a polyurethane polymer, a polycarbonate polymer, a polyester polymer, poly(vinylbenzoic acid) or combinations thereof;
wherein said first adhesion layer comprises a material selected from the group consisting of hexamethyldisilazane (HMDS) or ethylsilicate, ethylorthosilicate, tetraalkoxysilane, aminoethylaminopropyltrialkoxysilane, aminopropyltrialkoxysilane, aminoethyltrialkoxysilane, tetraalkoxytitanate or combinations thereof;
wherein said second adhesion layer comprises O-(vinyloxybutyl)-H-(triethoxysilylpropyl) -urethane or

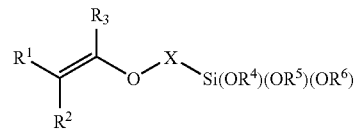

wherein X is a linking group selected from the group consisting of —C(O)O—, —C(O)—, —OC(O)—, —O—C(O)—C(O)—O—, NHC(O)—O—, —O—C(O)—O—, a linear or a branched alkylene having 1 to 7 carbon atoms, a cycloalkylene having 3 to 17 carbon atoms, an alkylcycloalkylene having 4 to 20 acarbon atoms and a cycloalkylalkylene having 4 to 20 carbon atoms,
wherein each R¹, R², R³, R⁴, R⁵, and R⁶(R¹- R⁶) is independently selected from the group consisting of a hydrogen atom and a hydrocarbyl substituent with a primary, a secondary or a tertiary carbon attachment point, said hydrocarbyl group selected from the group consisting of an alkyl group, an alkenyl group, an alkynyl group, an aralkyl group, an alkaryl and an aryl group, wherein each alkyl, alkenyl, alkynyl, aralkyl, alkaryl or aryl group has 1 to 20 carbon atoms and each alkyl group of the aralkyl, or alkaryl groups may be linear, branched or cyclic, and
wherein any two R¹-R⁶ in the same molecule may be linked to form the at least one carbon ring containing 3 to 8 carbon atoms;
wherein said aromatic divinyl ethers are selected from the group consisting of

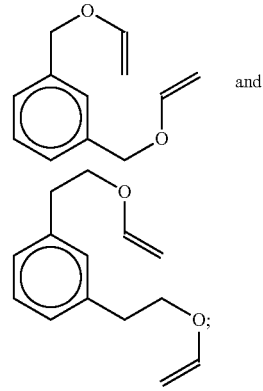

and wherein said molding composition further includes a photoacid generator and a stabilizing/sensitizing agent;
wherein said stabilizing/sensitizing agent is selected from the group consisting of

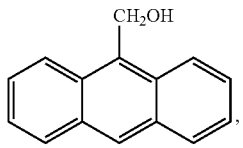

substituted 9-anthracenemethanols, phenothiazine, substituted phenothiazines,

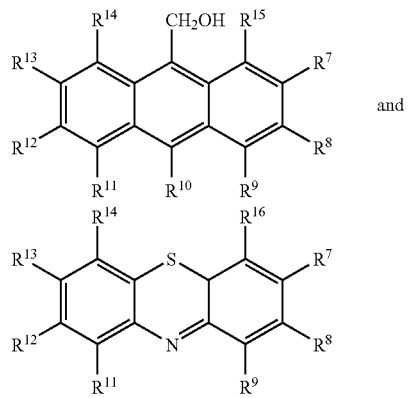

and wherein each $R^7$, $R^8$, $R^9$, $R^{10}$, $R^{11}$, $R^{12}$, $R^{13}$, $R^{14}$, $R^{15}$ and $R^{16}(R^7-R^{16})$ is independently selected from the group consisting of a hydrogen atom and a hydrocarbyl substituent with a primary, a secondary or a tertiary carbon attachment point, said hydrocarbyl group selected from the group consisting of an alkyl group having 1 to 20 carbon atoms, an alkenyl group having 1 to 20 carbon atoms, an alkynyl group having 1 to 20 carbon atoms, an aralkyl group having 1 to 20 carbon atoms, an alkaryl having 1 to 20 carbon atoms and an aryl group having 1 to 20 carbon atoms;
wherein the alkyl groups of the aralkyl and the alkaryl groups may be linear, branched or cyclic; and
wherein any two $R^7-R^{15}$ in the same molecule may be linked to form at least one carbon ring containing 3 to 8 carbon atoms;

said molding composition further including a fluorinated release agent selected from the group consisting of vinyl 2,2,2-trifluoroethyl ether,

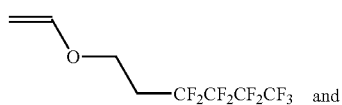

and $(R^{17})(R^{18})=(R^{19})OC_n(R^{20})(R^{21})(D)(R^{22})(R^{23})(R^{24})$,
wherein D is a carbon atom, wherein n is 1, wherein $R^{17}$, $R^{18}$, $R^{19}$, $R^{20}$ and $R^{21}$ are H, and $R^{22}$, $R^{23}$ and $R^{24}$ are fluorine groups; and
wherein said backfill material is selected from the group consisting of:
(1) a siloxane polymer, spin-on-glass, spin-on-organo-silicate glass silsesquioxanes having the formulas —$(SiO_2)$n-, a —$(R'SiO_{3/2})$n-, —$(R'_2SiO)$n- and —$(R''Si_2O_3)$n-, wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms, (2) a polymer containing at least 6 percent by weight of silicon, germanium, tin, titanium or other Group IVA/IVB metals, (3) one or more of $CH_2=CHOCH_2Si(CH_3)_3$, $CH_2=CHOCH_2CH_2Si(CH_3)_3$, $CH_2=CHOCH_2Si(CH_3)_2CH_2OCH=CH_2$, $CH_2=CHOCH_2Si(CH_3)_2OSi(CH_3)_2CH_2OCH=CH_2$, $CH_2=CHOCH_2CH_2Si(CH_3)_2CH_2CH_2OCH=CH_2$, $CH(CH_3)=CHOCH_2Si(CH_3)(CH_2OCH=CH(CH_3))CH_2OCH=CH(CH_3)$, $CH_2=CHOCH_2CH_2Si(Si(CH_3)_3)_3$, other silicon containing vinyl ethers and a photoacid generator; and (4) silicon containing acrylates and radical photoinitiator.

21. The method of claim 1, wherein said relief pattern comprises grooves and plateaus and wherein said trenches correspond to said grooves in said relief pattern.

22. The method of claim 1, wherein said molding layer is a single continuous layer.

23. The method of claim 10, wherein said relief pattern comprises grooves and plateaus and wherein said trenches correspond to said grooves in said relief pattern.

24. The method of claim 10, wherein said molding layer is a single continuous layer.

* * * * *